US011552418B2

(12) United States Patent
Lau

(10) Patent No.: US 11,552,418 B2
(45) Date of Patent: Jan. 10, 2023

(54) SYSTEMS AND METHODS OF PROVIDING REDUNDANT CARD EDGE CONNECTION

(71) Applicant: Rockwell Automation Asia Pacific Business Center Pte. Ltd

(72) Inventor: Leong You Lau, Yishun (SG)

(73) Assignee: ROCKWELL AUTOMATION ASIA PACIFIC BUSINESS CENTRE PTE. LTD., Singapore (SG)

( * ) Notice: Subject to any disclaimer, the term of this patent is extended or adjusted under 35 U.S.C. 154(b) by 219 days.

(21) Appl. No.: 17/034,069

(22) Filed: Sep. 28, 2020

(65) Prior Publication Data
US 2022/0102886 A1 Mar. 31, 2022

(51) Int. Cl.
H01R 12/00 (2006.01)
H01R 12/72 (2011.01)
H01R 12/73 (2011.01)

(52) U.S. Cl.
CPC ......... H01R 12/724 (2013.01); H01R 12/727 (2013.01); H01R 12/737 (2013.01)

(58) Field of Classification Search
CPC .. H01R 12/722; H01R 12/724; H01R 12/725; H01R 12/727; H01R 12/728; H01R 12/735; H01R 12/737
USPC .......................................... 439/59–62, 78–79
See application file for complete search history.

(56) References Cited

U.S. PATENT DOCUMENTS

| 3,986,766 A | * | 10/1976 | Sochor | H01R 12/79 |
| | | | | 439/660 |
| 6,345,989 B1 | * | 2/2002 | Mason | H05K 3/366 |
| | | | | 439/74 |
| 2008/0242128 A1 | * | 10/2008 | Hilty | H01R 13/2414 |
| | | | | 439/91 |
| 2019/0356089 A1 | * | 11/2019 | Costello | H01R 13/6471 |

* cited by examiner

Primary Examiner — Khiem M Nguyen

(57) ABSTRACT

A printed circuit board (PCB) includes a first set of pins on a first side of the PCB, a second set of pins on a second side of the PCB, and one or more vias connecting one or more pins from the first set of pins to one or more pins from the second set of pins.

10 Claims, 4 Drawing Sheets (a)

(b)

(c)

SYSTEMS AND METHODS OF PROVIDING REDUNDANT CARD EDGE CONNECTION

FIELD OF THE DISCLOSURE

This disclosure generally relates to systems and methods for providing a redundant or highly available printed circuit board (PCB) edge connection to improve the reliability and/or performance of a corresponding electrical device and/or system.

BACKGROUND OF THE DISCLOSURE

It is known to use edge connectors to connect or join two or more printed circuit boards (PCBs) together to transfer electrical signals between the connected PCBs. For example, a mother board and a daughter board may be arranged perpendicular to each other connected through an edge connector. In some cases, the edge connector includes opposed electrical contacts. The card edge (e.g., an end portion) of the daughter board includes multiple electrically conductive contact pads or pins that are printed, laminated, bonded, or deposited on one or both sides (e.g., front and back) or in between one or more layers of the board. When the card edge of the daughter board is inserted into the edge connector that is attached to the mother board, each of the multiple pins on both of sides of the daughter board physically contact the opposed electrical contacts or contact fingers of the edge connector to establish or form multiple signal channels. The opposed electrical contacts or fingers of the edge connector are typically spring biased into contact with the corresponding pins of the PCB when the PCB edge is inserted into the connector.

In industrial manufacturing and plant-floor environments as well as other environments and applications, shock, vibration, and/or other unintended movements of an industrial automation device housing one or more PCBs may cause the pins located on one side of a PCB to disconnect or disengage from the corresponding contacts of an edge connector if a force applied to the device exceeds the spring force applied by the connector contacts or fingers. The result can be intermittent signal discontinuities which can reduce the reliability and/or performance of the device or industrial control system. For example, when a daughter board is inadvertently forced toward one side of the edge connector, only that side of the edge connector may remain in contact with the daughter board, and the pins on the opposite side of the PCB may disconnect or disengage from the associated edge connector contacts resulting in signal discontinuities and degraded system reliability and/or performance. Therefore, it is advantageous to provide systems and methods for providing redundant electrical connections between a PCB and a connector to enable continuous and uninterrupted signal transmission in high shock and/or vibration environments for improving system or device reliability and/or performance.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

DETAILED DESCRIPTION

Before turning to the features, which illustrate the exemplary embodiments in detail, it should be understood that the application is not limited to the details or methodology set forth in the description or illustrated in the figures. It should also be understood that the terminology is for the purpose of description only and should not be regarded as limiting.

Some embodiments of the present invention relate to a printed circuit board (PCB) including a first set of electrically conductive (such as metallic) contact pads or pins on a first side of the PCB, a second set of electrically conductive (such as metallic) contact pads or pins on a second side of the PCB, and one or more electrically conductive (such as metallic) vias or through-holes connecting one or more pins from the first set of pins to one or more pins from the second set of pins through electrically conductive (such a metallic) circuit board traces associated with the PCB.

Some embodiments of the present invention relate to an electrical circuit assembly including a printed circuit board (PCB) configured for providing redundant edge connections. The PCB includes a first set of electrically conductive (such as metallic) contact pads or pins on a first side of the PCB, a second set of electrically conductive (such as metallic) contact pads or pins on a second side of the PCB, and one or more electrically conductive (such as metallic) contact pads or vias or through-holes connecting one or more pins from the first set of pins to one or more pins from the second set of pins through electrically conductive (such a metallic) circuit board traces associated with the PCB.

Some embodiments relate to a method for fabricating a printed circuit board. The method includes: forming a first set of electrically conductive (such as metallic) contact pads or pins on a first side of the PCB; forming a second set of electrically conductive (such as metallic) contact pads or pins on a second side of the PCB; forming one or more electrically conductive (such as metallic) contact pads or vias; and connecting one or more pins from the first set of pins to one or more pins from the second set of pins through the one or more vias through electrically conductive (such as metallic) circuit board traces.

Figure 1:
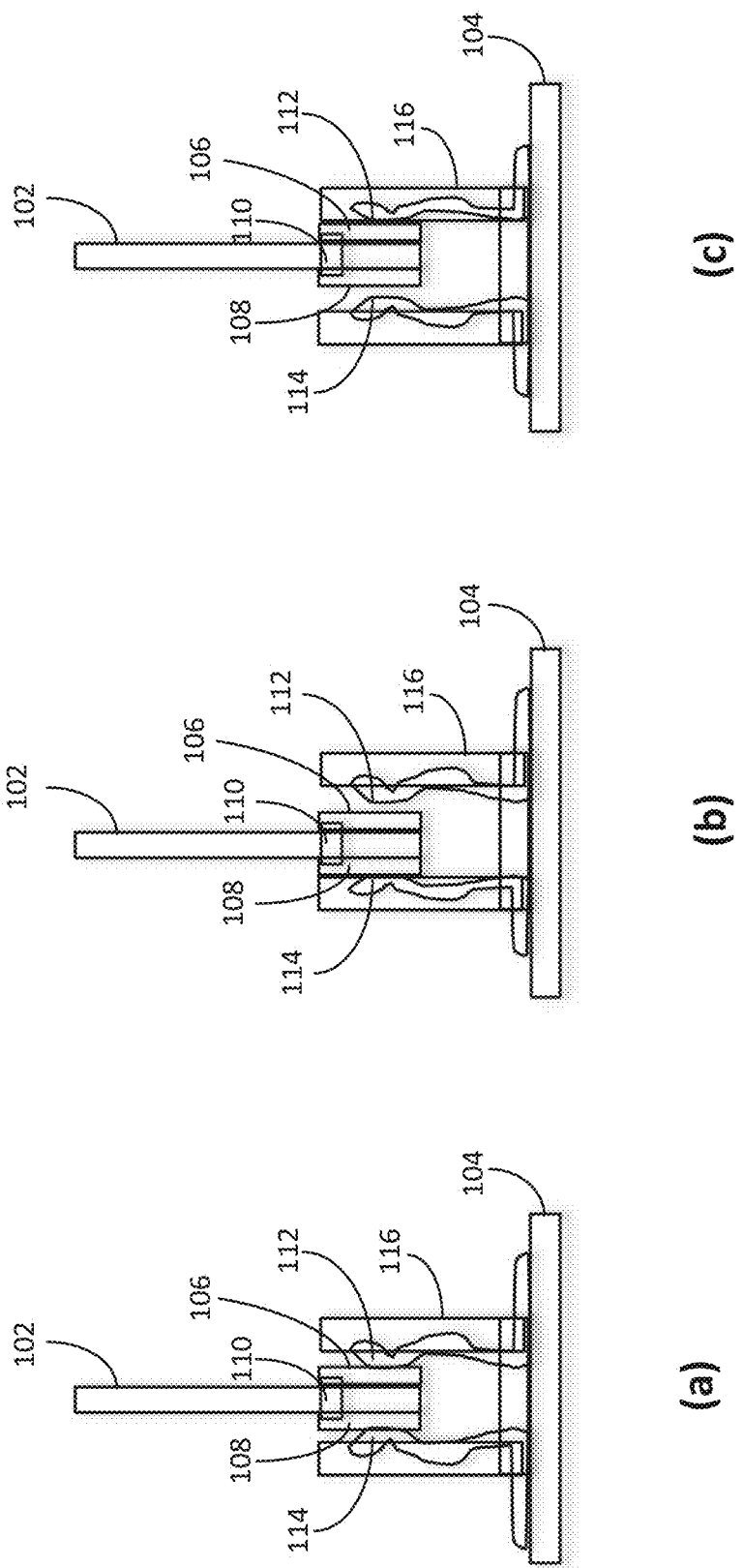
FIG. 1 is a cross-sectional view of a redundant edge connection between two PCBs according to an illustrative embodiment.

With reference now to FIG. 1, a cross-sectional view of a redundant edge connection between two PCBs is shown according to an illustrative embodiment. A first PCB 102 having passive and/or active electrical components (e.g. resistors, transistors, integrated circuits, etc.) forming one or more electrical circuits mounted thereto is connected to a second PCB 104 (also having such electrical components) via an edge connector 116. In some embodiments, the first and the second PCBs 102 and 104 may be arranged in a horizontal connection or vertical connection through the edge connector 116. The edge connector can be any suitable connector for electrically interconnecting the PCBs. The first PCB 102, the second PCB 104, and the edge connector 116 may be part of any type of electrical device or circuit assembly.

The first PCB 102 includes a first set of electrically conductive (such as metallic) contact pads or pins 106 printed, laminated, bonded or deposited on a first side of the first PCB 102 and a second set of electrically conductive (such as metallic) contact pads or pins 108 also printed, laminated, bonded or deposited on a second side of the first PCB 102. The first and second sets of pins 106 and 108 are electrical contacts used for signal transmission to and/or from the PCB 102. The first PCB 102 also includes electrically conductive (such as metallic) vias or through-holes 110 drilled through the first PCB 102 and then printed, laminated, bonded or deposited with an electrically conductive material (e.g. copper) to electrically connect one or more pins of the first set of pins to one or more corresponding pins of the second set of pins through corresponding electrically conductive (such as metallic) circuit board traces which are also printed, laminated, bonded or deposited on the opposing sides, or between layers, of the PCB. In other words, one or more pins on the first side of the first PCB 102 are in electrical contact with (i.e. are electrically redundant) one or more corresponding pins on the second side of the first PCB 102 through the via 110 and corresponding circuit board traces. In this way, the first PCB 102 provides redundant pins located on both sides of the board.

The edge connector 116 is a vertical connector as shown in FIG. 1. In some embodiments, the edge connector 116 may be a horizontal connector (e.g., an edge mount connector) that enables the first and the second PCBs 102 and 104 to be connected in a horizontal arrangement. In both cases, the edge connector 116 includes a first set of electrical contacts or contact fingers 112 and a second set of electrical contacts or contact fingers 114 arranged in opposed sides within the edge connector 116. The first electrical contacts 112 are configured to engage the first set of pins 106 of the first PCB 102 with a predetermined spring force when the first PCB 102 is inserted into the edge connector 116. Likewise, the second electrical contacts 114 are configured to engage the second set of pins 108 of the first PCB 102 also with a predetermined spring force when the first PCB 102 is inserted into the edge connector 116.

When the first PCB 102, the second PCB 104, and/or the edge connector 116 within an electrical device housing are moved or displaced as a result of excessive vibration and/or shock during operation of the electrical device, one or more pins of the first PCB 102 can be inadvertently disconnected or disengaged from the corresponding electric contacts of the edge connector 116 when the force applied to the electrical device exceeds the spring force applied by the connector contacts or fingers 112, 114 thus interrupting the signal flow to or from the PCB. For example, when the first PCB 102 moves from an intended or normal insertion position shown in FIG. 1(*a*) to a first inadvertent shifted (i.e. leftward) insertion position shown in FIG. 1(*b*), one or more of the first set of pins 106 can be inadvertently disconnected or disengaged from the corresponding electrical contacts 112 while the second set of pins 108 remain in physical and electrical contact with the second set of electrical contacts 114 thus providing a redundant path for signals transmitted to or from the PCB during high shock and/or vibration situations. Similarly, when the first PCB 102 moves from an intended insertion position as shown in FIG. 1(*a*) to a second shifted (i.e. rightward) insertion position as shown in FIG. 1(*c*), one or more of the second set of pins 108 can be inadvertently disconnected or disengaged from the corresponding electrical contacts 114 while the first set of pins 106 remain in physical and electrical contact with the first set of electrical contacts 112 thus providing a redundant path for signals transmitted to or from the PCB during high shock and/or vibration situations.

Therefore, when either side of the first PCB 102 is inadvertently forced away from a corresponding electrical contact of the edge connector 116, the PCB 102 provides continuous signal transmission paths through the redundant PCB pin arrangement. For example, when one or more of the first set of pins 106 are disconnected or disengaged from the corresponding first electrical contacts 112 as shown in FIG. 1(*b*), signals are transmitted through the connection between the second set of pins 108 and corresponding second electrical contacts 114 and further through the corresponding vias 110 and circuit board traces to one or more of the electrical components that are mounted to the PCB. Similarly, when one or more of the second set of pins 108 are disconnected or disengaged from the corresponding second electrical contacts 114 as shown in FIG. 1(*c*), signals are transmitted through the connection between the first set of pins 106 and the corresponding first electrical contacts 112 and further through the corresponding vias 110 and circuit board traces to one or more of the electrical components that are mounted to the PCB. In this way, even if one side of the first PCB 102 is inadvertently disconnected or disengaged from the edge connector contacts, signals are continuously transmitted between the first and the second PCBs 102 and 104 without interruption or degradation of the device or system reliability or performance.

Figure 2A:
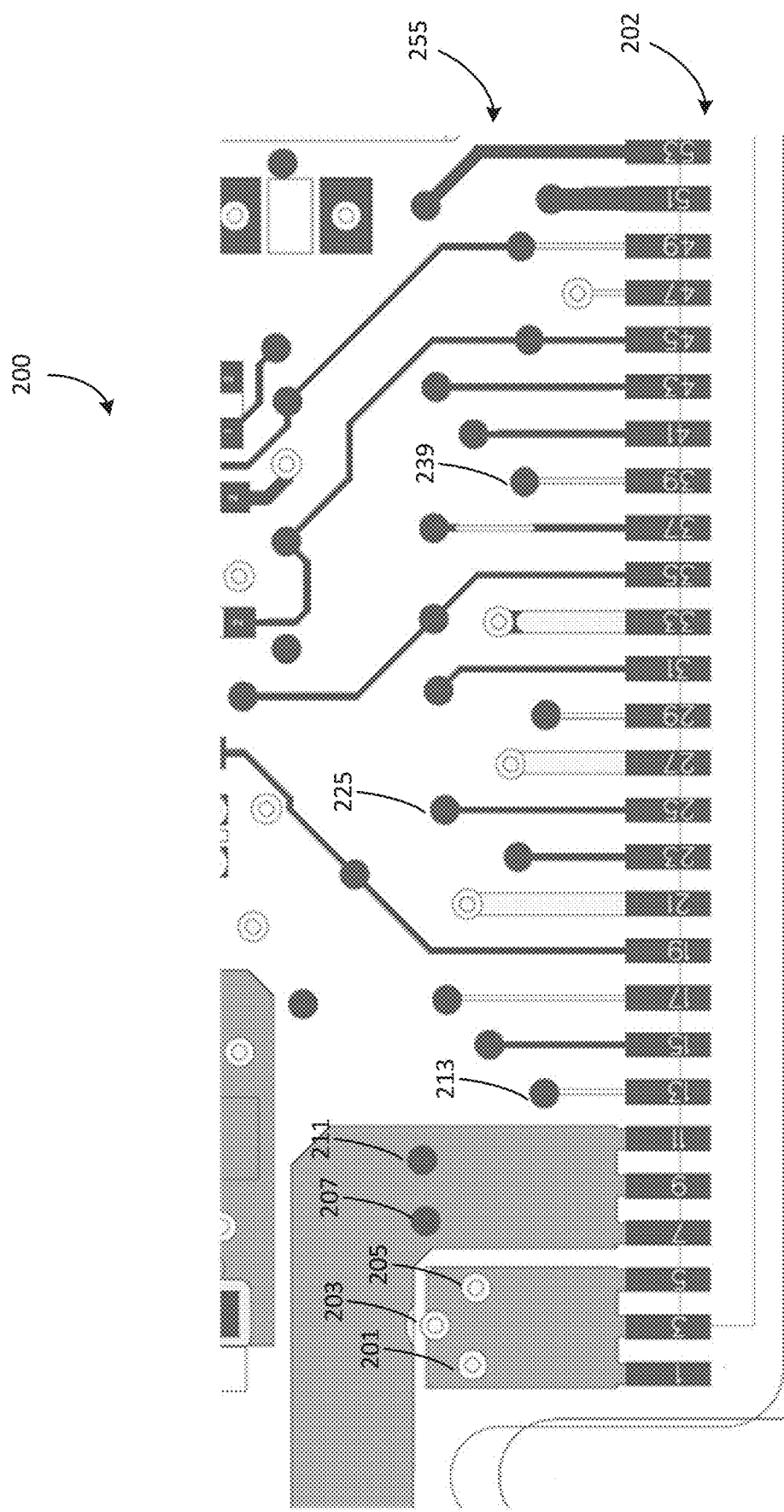
FIG. 2A shows a PCB from a top view according to an illustrative embodiment.
Figure 2B:
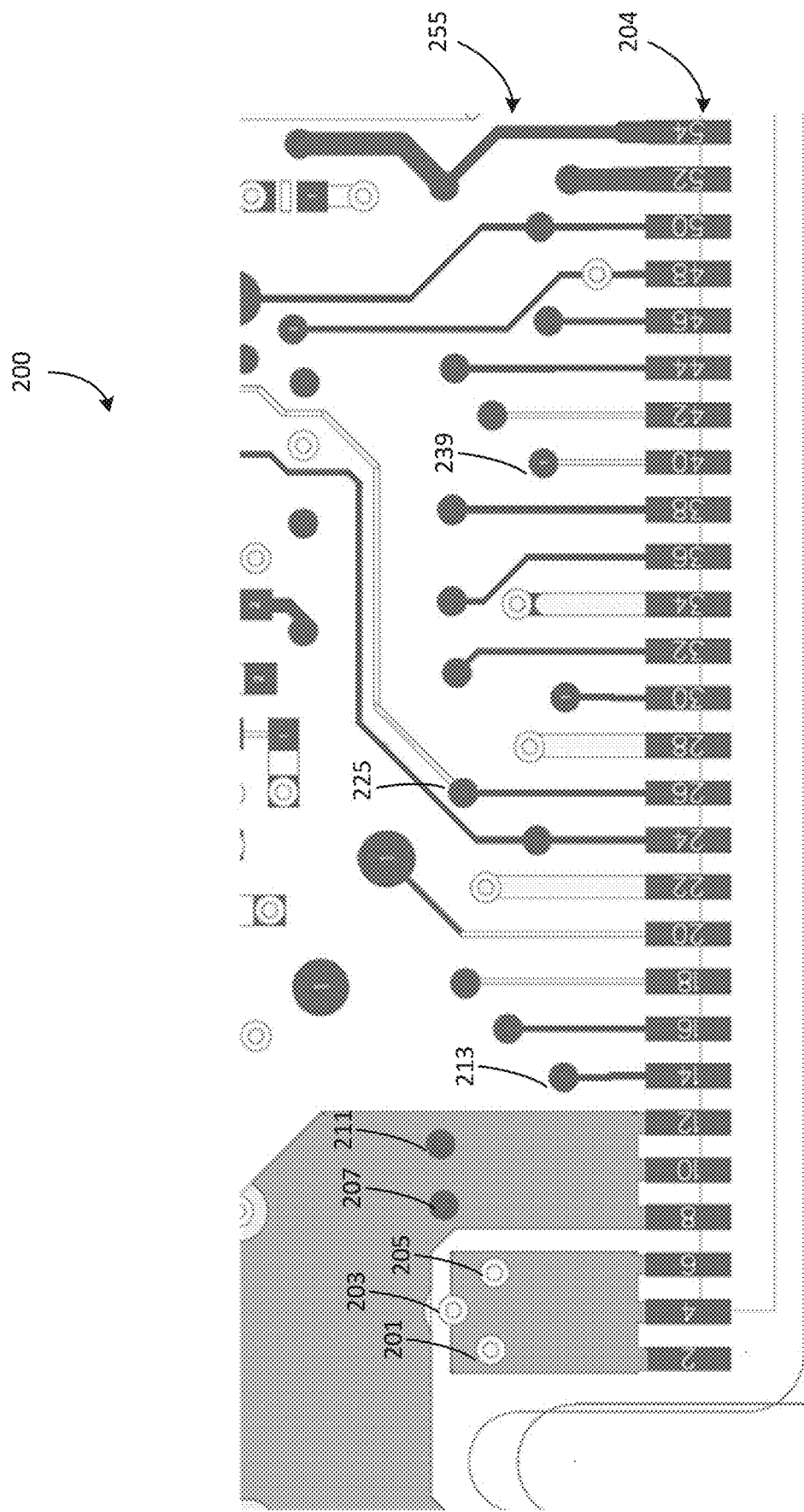
FIG. 2B shows the PCB of FIG. 2A from a bottom view according to an illustrative embodiment.

Similarly, FIG. 2A shows a PCB 200 from a top view, and FIG. 2B shows the PCB 200 of FIG. 2A from a bottom view according to an illustrative embodiment. The PCB 200 is configured similarly as the first PCB 102 of FIG. 1. The PCB 200 includes a first set of electrically conductive (such as metallic) contact pads or pins 202 (e.g., pins 1, 3, 5, 7 . . . ) printed, laminated, bonded or deposited on a first side of the PCB 200 as shown in FIG. 2A and a second set of electrically conductive (such as metallic) contact pads or pins 204 (e.g., pins 2, 4, 6, 8 . . . ) printed, laminated, bonded or deposited on a second side of the PCB 200 as shown in FIG. 2B. The PCB 200 also includes one or more electrically conductive (such as metallic) vias or through-holes 255 drilled through the PCB 200 and then printed, laminated, bonded or deposited with an electrically conductive material (e.g. copper) to electrically connect one or more pins from the first set of pins 202 to one or more pins from the second set of pins 204 through corresponding electrically conductive (such as metallic) circuit board traces which are also printed, laminated, bonded or deposited on the opposing sides, or between layers, of the PCB. The one or more vias 255 extend through the PCB 200 from a surface on the first side to a surface on the second side. In this way, the PCB 200 includes one or more pairs of redundant pins on opposing sides of the PCB. Each pair of redundant pins includes a first pin from the first set of pins and a second pin from the second set of pins connected by a corresponding via 255 and circuit board trace. For example, the pin 13 on the first side of the PCB 200 is connected to the pin 14 on the second side of the PCB 200 through the via 213. The pin 25 on the first side of the PCB 200 is connected to the pin 26 on the second side of the PCB 200 through the via 225. The pin 39 on the first side of the PCB 200 is connected to the pin 40 on the second side of the PCB 200 through the via 239.

In some embodiments, the PCB 200 includes a subset of pins (e.g., pins 1, 3, and 5, and pins 7, 9, and 11) connected together on the first side of the PCB 200. The PCB also includes a redundant subset of pins connected on the second side of the PCB 200. For example, the subset of pins 1, 3, and 5 on the first side of the PCB 200 as shown in FIG. 2A is redundant to the subset of pins 2, 4, and 6 on the second side of the PCB 200 as shown in FIG. 2B. The subset of pins 7, 9, and 11 on the first side of PCB 200 as shown in FIG. 2A is redundant to the subset of pins 8, 10, and 12 on the second side of the PCB 200 as shown in FIG. 2B. Each subset of pins and its redundant subset of pins are connected through one or more vias. For example, the subset of pins 1, 3, and 5, and the redundant subset of pins 2, 4, and 6 are connected through the vias 201, 203, and 205. The subset of pins 7, 9, and 11, and the redundant subset of pins 8, 10, and 12 are connected through the vias 207 and 211. In some embodiments, the number of vias used for each redundant subset of pins is determined based at least in part on a power requirement for signal transmission. In some embodiments, vias are provided for the pins that require redundancy on both sides of the PCB 200 to secure continuous transmission.

Figure 3:
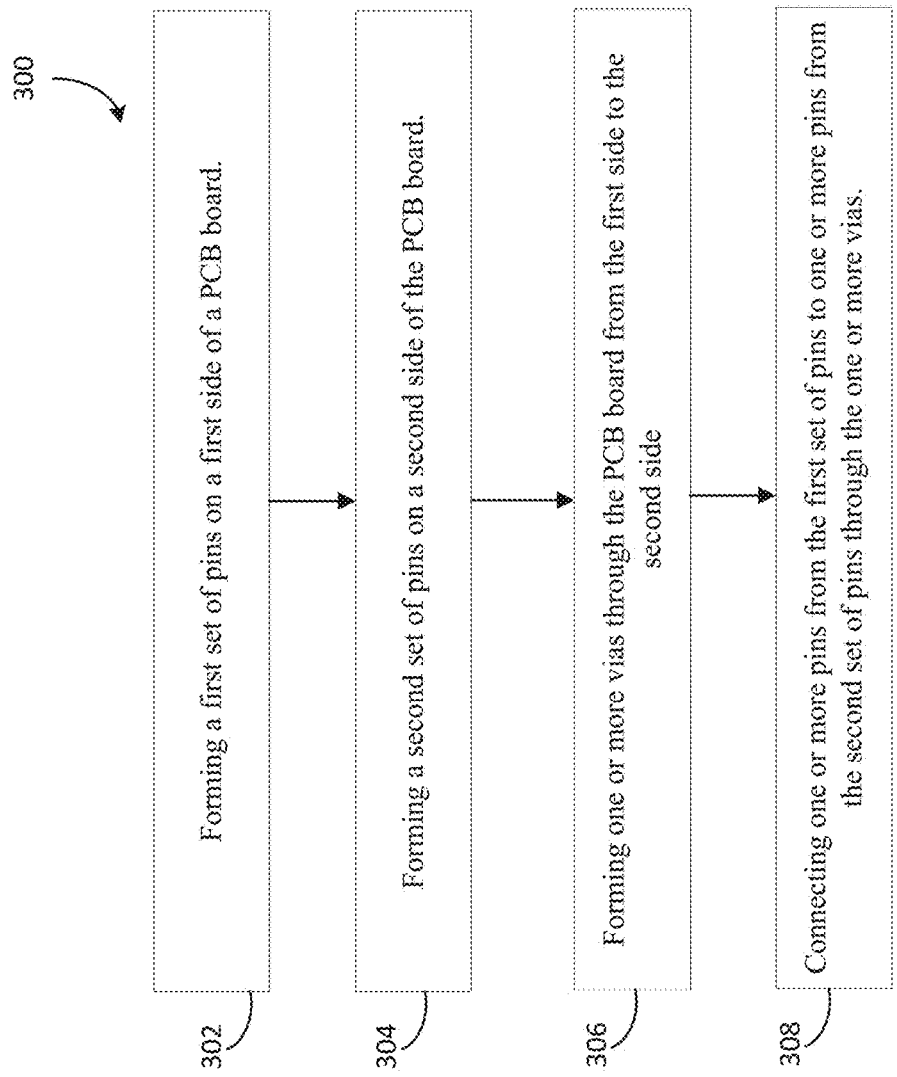
FIG. 3 is a flow of fabricating a PCB edge for providing redundant edge connection according to some example embodiments.

FIG. 3 shows a flow diagram 300 for fabricating a PCB with redundant edge contacts according to some example embodiments. At an operation 302, a first set of pins and corresponding electrical circuit board traces are formed from an electrically conductive (or metallic such as copper) material on a first side of the PCB. In some embodiments, the first set of pins may include one or more subsets of pins grouped together. Each subset of pins includes multiple pins that are electrically connected.

At an operation 304, a second set of pins and corresponding electrical circuit board traces are formed from an electrically conductive (or metallic such as copper) material on a second side of the PCB. The second side is opposite to the first side. For example, the first side is a front side and the second side is back side. In some embodiments, the second set of pins may include one or more subsets of pins grouped together. Each subset of pins includes multiple pins that are electrically connected.

At an operation 306, one or more vias are formed or drilled through the PCB from the first side to the second side. The one or more vias may be formed using any suitable technology and conductive material (e.g. metallic such as copper) to form an electrical connection from the first side to the second side of the PCB.

At an operation 308, one or more pins from the first set of pins on the first side of the PCB are connected to one or more pins from the second set of pins on the second side of the PCB. Two connected pins from both sides of the PCB forms a pair of redundant pins. The pair of redundant pins enables continuous signal transmission through the PCB when one of the pair of redundant pins is disconnected from an edge connector. In some embodiments, one or more subsets of pins on the first side of the PCB are connected to one or more subsets of pins on the second side of the PCB through one or more vias.

The disclosure is described above with reference to drawings. These drawings illustrate certain details of specific embodiments that implement the systems and methods and programs of the present disclosure. However, describing the disclosure with drawings should not be construed as imposing on the disclosure any limitations that are present in the drawings. No claim element herein is to be construed as a "means plus function" element unless the element is expressly recited using the phrase "means for." Furthermore, no element, component or method step in the present disclosure is intended to be dedicated to the public, regardless of whether the element, component or method step is explicitly recited in the claims.

It should be noted that certain passages of this disclosure can reference terms such as "first" and "second" in connection with devices for purposes of identifying or differentiating one from another or from others. These terms are not intended to relate entities or operations (e.g., a first region and a second region) temporally or according to a sequence, although in some cases, these entities can include such a relationship. Nor do these terms limit the number of possible entities or operations. Further, the term drain/source region refers to a source region, a drain region, or a region that can be used as a source or a drain.

It should be understood that the circuits described above can provide multiple ones of any or each of those components. In addition, the structures, circuits, and methods described above can be adjusted for various system parameters and design criteria, such as shape, depth, thicknesses, etc. Although shown in the drawings with certain components directly coupled to each other, direct coupling is not shown in a limiting fashion and is exemplarily shown. Alternative embodiments include circuits with indirect coupling between the components shown.

It should be noted that although the flowcharts provided herein show a specific order of method steps, it is understood that the order of these steps can differ from what is depicted. Also, two or more steps can be performed concurrently or with partial concurrence. Such variation will depend on the software and hardware systems chosen and on designer choice. It is understood that all such variations are within the scope of the disclosure.

While the foregoing written description of the methods and systems enables one of ordinary skill to make and use what is considered presently to be the best-mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A printed circuit board (PCB) comprises:
   one or more pairs of redundant pins, each pair of redundant pins comprising:
      a first pin on an edge portion of a first side of the PCB;
      a second pin on an edge portion of a second side of the PCB opposing to the first side; and
      a via through the PCB from the first side to the second side electrically connecting the first pin to the second pin;
   wherein the one or more pairs of redundant pins provide redundant edge connections to an edge connector.

2. An electrical circuit assembly comprising:
   a printed circuit board (PCB) configured for providing redundant edge connections, the PCB comprising:
      a first set of electrical contacts on a first side of the PCB;
      a second set of electrical contacts on a second side of the PCB; and
      one or more vias through the PCB from the first side to the second side that electrically connect one or more electrical contacts from the first set of electrical contacts to one or more corresponding redundant electrical contacts from the second set of electrical contacts.

3. The electrical circuit assembly of claim 2, wherein the PCB further comprises an edge portion configured to connect to one or more edge connectors.

4. The electrical circuit assembly of claim 3, wherein the edge portion comprises the first set of electrical contacts and the second set of electrical contacts.

5. The electrical circuit assembly of claim 2, wherein the first set of electrical contacts comprises one or more first subsets of electrical contacts connected, wherein the second set of electrical contacts comprises one or more second subsets of electrical contacts connected together.

6. The electrical circuit assembly of claim 5, wherein the one or more first subsets of electrical contacts are connected to the one or more second subsets of electrical contacts through one or more vias.

7. An electrical circuit assembly comprising:
a first printed circuit board (PCB) comprising one or more pairs of redundant pins, each pair of redundant pins comprising:
a first pin on an edge portion of a first side of the first PCB;
a second pin on an edge portion of a second side of the first PCB opposing to the first side; and
a via through the first PCB from the first side to the second side electrically connecting the first pin to the second pin;
a second PCB; and
an edge connector electrically connecting the first PCB to the second PCB;
wherein the one or more pairs of redundant pins of the first PCB provide redundant edge connections between the first PCB and the edge connector.

8. The electrical circuit assembly of claim 7, wherein the edge connector comprises:
a first set of electrical contacts configured to engage the first pins on the first side of the first PCB; and
a second set of electrical contacts configured to engage the second pins on the second side of the first PCB.

9. The electrical circuit assembly of claim 8, wherein when the first PCB is forced toward one side of the edge connector and one or more first pins are thus disengaged from the first set of electrical contacts of the edge connector, the second pins remain in physical and electrical contact with the second set of electrical contacts.

10. The electrical circuit assembly of claim 7, wherein the first PCB is a daughter board and the second PCB is a mother board.

* * * * *